United States Patent [19]
Ryat

[11] Patent Number: 5,481,180
[45] Date of Patent: Jan. 2, 1996

[54] PTAT CURRENT SOURCE

[75] Inventor: Marc H. Ryat, Santa Clara, Calif.

[73] Assignee: SGS-Thomson Microelectronics, Inc., Carrollton, Tex.

[21] Appl. No.: 112,807

[22] Filed: Aug. 27, 1993

Related U.S. Application Data

[63] Continuation-in-part of Ser. No. 70,276, Jun. 1, 1993, and a continuation-in-part of Ser. No. 70,274, Jun. 1, 1993, and a continuation-in-part of Ser. No. 31,647, Mar. 15, 1993, and a continuation-in-part of Ser. No. 950,091, Sep. 23, 1992, abandoned.

[30] Foreign Application Priority Data

Sep. 30, 1991 [FR] France .................................. 91 12278
Sep. 28, 1992 [EP] European Pat. Off. .............. 92420333

[51] Int. Cl.⁶ .................................................. G05F 3/26
[52] U.S. Cl. .......................................... 323/315; 327/350
[58] Field of Search ...................................... 323/312, 313, 323/315, 316, 317, 281, 907; 327/334, 362, 350; 363/73; 330/288, 277

[56] References Cited

U.S. PATENT DOCUMENTS

| | | | |
|---|---|---|---|
| 4,583,037 | 4/1986 | Sooch ...................................... | 323/315 |
| 4,835,487 | 5/1989 | Doyle et al. ............................. | 330/277 |
| 4,897,596 | 1/1990 | Hughes et al. .......................... | 323/315 |
| 5,087,891 | 2/1992 | Cytera ..................................... | 330/288 |
| 5,245,273 | 9/1993 | Greaves et al. ......................... | 323/313 |
| 5,257,039 | 10/1993 | Chung et al. ........................ | 323/315 X |

*Primary Examiner*—Peter S. Wong
*Assistant Examiner*—Adolf Berhane
*Attorney, Agent, or Firm*—Richard A. Bachand; Lisa K. Jorgenson; Richard K. Robinson

[57] ABSTRACT

A PTAT current source has first and second current mirror circuits, each comprising a cascode transistor, an output transistor in series with the cascode transistor, and a base current compensating transistor having a control element connected to the cascode transistor on a side away from the output transistor, and a current flow path element connected to a current control element of the output transistor, the cascode transistors of the first and second current mirror circuits having differently sized emitter areas. A resistor is connected between the cascode transistors of the first and second current mirror circuits across which a differential current is developed. An output circuit develops a current in the output transistor of the second current mirror circuit. In one embodiment, a third mirror circuit is provided, to cancel a portion of an emitter current flowing in the output transistor of the second current mirror circuit.

25 Claims, 2 Drawing Sheets

PTAT CURRENT SOURCE

CROSS-REFERENCE TO RELATED APPLICATIONS

This application is a continuation-in-part of U.S. patent application Ser. No. 08/070,276, filed Jun. 1, 1993, entitled "LOGARITHMIC AND EXPONENTIAL CONVERTER CIRCUITS", and a continuation-in-part of application Ser. No. 08/070,274, filed Jun. 1, 1993, entitled "WIDEBAND LINEAR AND LOGARITHMIC SIGNAL CONVERSION CIRCUITS", and a continuation-in-part of U.S. patent application Ser. No. 08/031,647, filed Mar. 15, 1993, entitled "LINEAR TRANSCONDUCTORS", and a continuation-in-part of U.S. patent application Ser. No. 07/950,091, filed Sep. 23, 1992, abandoned, entitled "A PRECISE CURRENT GENERATOR", by applicant herein, said last-mentioned patent application claiming priority from French Application 91/12278, filed Sep. 30, 1991, by applicant herein, all of which are incorporated herein by reference.

BACKGROUND OF THE INVENTION

1. Field of the Invention

This invention relates to improvements in current source circuits, and more particularly to improvements in current source circuits that provide a current that is proportional to absolute temperature (PTAT).

2. Relevant Background Information

Current source circuits that provide a current that is proportional to absolute temperature have many uses. In the past, such circuits suffered numerous deficiencies.

High output impedance, cascode current mirrors were necessary to force equal currents in two bipolar transistors of different emitter areas, thereby increasing the minimum operating supply. Also, reliable start-up was not enjoyed under all conditions. When a start-up circuitry was present, it had to be disconnected from the circuit not to affect the output current value when an equilibrium was reached. Sensing of that equilibrium was also difficult to implement in a reliable way. Other shortcomings of the classical solutions were the use of operational amplifiers, or current gain dependent output.

SUMMARY OF THE INVENTION

In light of the above, it is, therefore, an object of the invention to provide an improved current source circuit.

It is still another object of the invention to provide a current source circuit of the type described that can be implemented under low supply voltages.

It is still another object of the invention to provide a current source circuit of the type described that produces an output current that is proportional to absolute temperature.

It is still another object of the invention to provide an improved current source circuit of the type described in which the outputs are essentially independent of the beta of the transistors used, resulting in extremely stable high temperature capabilities.

It is yet another object of the invention to provide a current source circuit of the type described that can be implemented without operational amplifiers, thus saving total circuit area.

It is yet another object of the invention to provide an improved current source circuit of the type described that is self-starting, and in which the output current is independent of the start-up current value, and from which the start-up current source does not have to be disconnected after current build-up, while still providing a beta-independent, multiple output.

It is still another object of the invention to provide a logarithmic amplifier circuit in which the PTAT current source of the invention is embodied.

These and other objects, features and advantages of the invention will be apparent to those skilled in the art from the following detailed description of the invention, when read in conjunction with the accompanying drawings and appended claims.

In accordance with a broad aspect of the invention, a PTAT current source is presented having first and second half-cascode mirror circuits. The first and second half-cascode mirror circuits are constructed to produce a difference in a base-emitter voltage drop of a first cascode transistor of the first cascode mirror circuit from a base-emitter voltage drop across a second cascode transistor of the second cascode mirror circuit as a function of a thermal voltage times a logarithm of a size ratio between emitter areas of the first and second cascode transistors. A third mirror circuit is connected to the second mirror circuit to provide an output current that may be a multiple of a current in an output transistor of the second current cascode mirror circuit.

In accordance with another broad aspect of the invention, a PTAT current source is presented. The current source has first and second current mirror circuits. Each of the current mirror circuits has a cascode transistor, an output transistor in series with the cascode transistor, and a base current compensating transistor having a base element connected to the cascode transistor on a side away from the output transistor.

The PTAT current source may also have a third current mirror circuit, comprising a cascode transistor, an output transistor in series with the cascode transistor, and a base current compensating transistor having a base element connected to the cascode transistor on a side away from the output transistor. A current canceling transistor is connected across the cascode transistor, having a base element connected to a base element of the output transistor of the third current mirror circuit, wherein a portion of the current flowing in the output transistor of the second current mirror circuit is diverted through the current canceling transistor.

The PTAT current source may also have a fourth mirror circuit connected to produce an output current that mirrors the current flowing in the current mirror transistor of the second current mirror circuit. The fourth current mirror circuit can be formed having a first current flow path, connected to mirror a current flowing in the current mirror transistor of the second current mirror circuit.

In accordance with yet another broad aspect of the invention, another embodiment of a current source that produces an output current proportional to absolute temperature is provided. The current source has a first half-cascode current mirror section, including a cascode transistor, an active transistor, and a base current compensating transistor. The cascode transistor is connected between the collectors of a current source transistor and the active transistor. The base current compensating transistor is connected between a voltage source and a base of the active transistor. The base of the current compensating transistor is connected to the collector of the cascode transistor. The current source also has a second half-cascode current mirror section, including a cascode transistor, an active transistor, and a base current compensating transistor. The cascode transistor is connected between the collectors of the current source transistor and the active transistor. The base current compensating transistor is connected between a voltage source and a base of the active transistor. The base of the current compensating transistor is connected to the collector of the cascode transistor.

The respective cascode transistors of the first and second half-cascode current mirror sections are configured such that the emitter area of the cascode transistor of the first half-cascode current mirror section is n-times larger than that of the cascode transistor of the second half-cascode current mirror section. The respective cascode transistors of the first and second half-cascode current mirror sections also have a resistor of value R connected between their emitters. A mirror transistor is connected across the active transistor of the second half-cascode mirror section, the mirror transistor having a base connected to a base of the active transistor of the first half-cascode current mirror section. An output circuit is connected to mirror a current in the active transistor of the second half-cascode current mirror section.

In accordance with still yet another broad aspect of the inventions, another embodiment of a current source that produces an output current proportional to absolute temperature is presented. The current source has a first half-cascode current mirror section, including a cascode transistor, an active transistor, and a base current compensating transistor. The cascode transistor is connected between the collectors of a current source transistor and the active transistor. The base current compensating transistor is connected between a voltage source and a base of the active transistor. The base of the current compensating transistor is connected to the collector of the cascode transistor. The current source also a second half-cascode current mirror section, including a cascode transistor, an active transistor, and a base current compensating transistor. The cascode transistor is connected between the collectors of the current source transistor and the active transistor. The base current compensating transistor is connected between a voltage source and a base of the active transistor. The base of the current compensating transistor is connected to the collector of the cascode transistor. The respective cascode transistors are configured such that the emitter area of the cascode transistor of the first half-cascode current mirror section is n-times larger than that of the cascode transistor of the second half-cascode current mirror section. A resistor of value R is connected between the cascode transistors. The current source additionally has a third half-cascode current mirror section, including a cascode transistor, an active transistor, and a base current compensating transistor. The cascode transistor is connected between the collectors of the current source transistor and the active transistor. The base current compensating transistor is connected between a voltage source and a base of the active transistor.

A mirror transistor is connected across the active transistor of the second half-cascode mirror section. The mirror transistor has a base connected to a base of the active transistor of the third half-cascode current mirror section. An output circuit is connected to mirror a current in the active transistor of the second half-cascode current mirror section.

In accordance with another broad aspect of the invention, a logarithmic amplifier circuit is presented. The logarithmic circuit includes first and second mirror circuits, each having an active transistor, a cascode transistor, and a base current compensating transistor. The cascode and active transistors are connected in series between an input node connected to the cascode transistor and a reference potential connected to the active transistor. A base of the cascode transistor is connected to a bias voltage, and the base current compensating transistor is connected between a supply voltage source and a base of the active transistor. A base of the base current compensating transistor is connected to the input node. A resistor is connected between the cascode and active transistors of the first and second mirror circuits. An output circuit develops first and second output signals in response to a current flowing of one of said active transistors. When an input current is applied between the input node and the supply voltage source of the first mirror circuit, and a first reference current is applied between the input node and the supply voltage source of the second mirror circuit, the first and second output signals have a logarithmic relationship to the input current. A translinear cell, such as a Gilbert gain cell, or the like, is connected to receive as inputs said first and second output signals from said logarithmic amplifier, and to produce a pair of outputs that are ratios of the first and second output signals. A PTAT current source, that can be constructed in the manner described above, has two outputs, each connected to provide reference currents to respective sides of said translinear cell.

BRIEF DESCRIPTION OF THE DRAWINGS

The invention is illustrated in the accompanying drawings, in which.

In the various figures of the drawings, like reference numerals are used to denote like or similar parts.

DETAILED DESCRIPTION OF THE PREFERRED EMBODIMENTS

Figure 1:
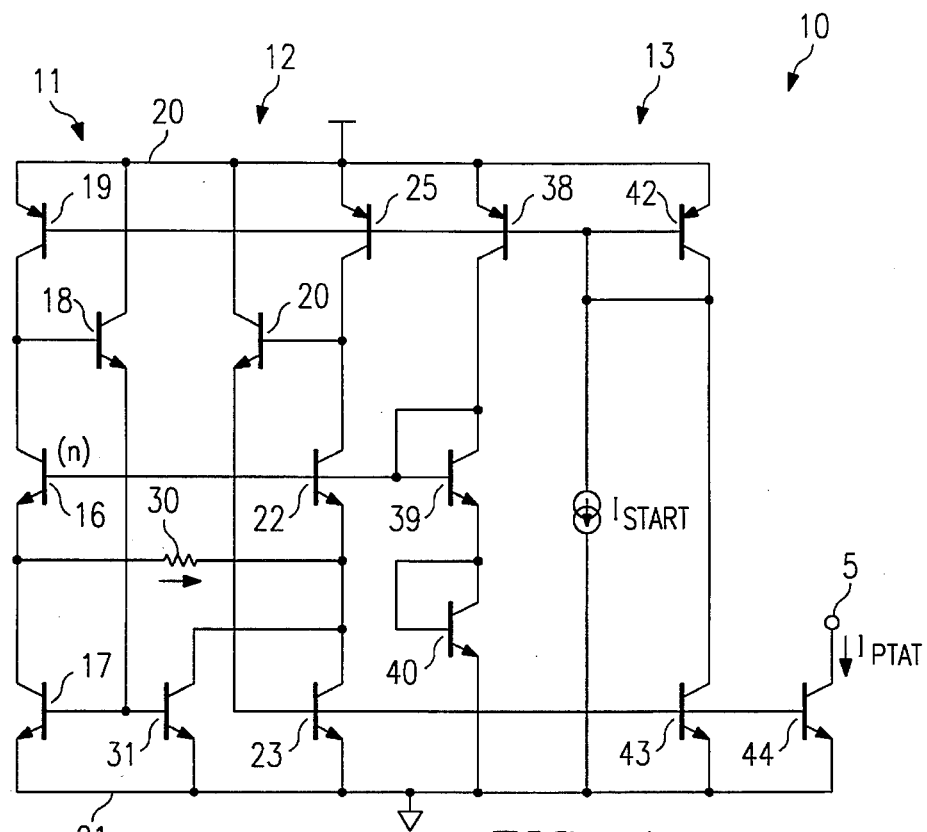
FIG. 1 is an electrical schematic diagram of a current source that provides an output current proportional to absolute temperature, in accordance with a preferred embodiment of the invention.

An electrical schematic diagram of an embodiment of a current source 10 that produces an output current on output terminal 5 proportional to absolute temperature (PTAT), in accordance with the invention, is shown in FIG. 1. The current source 10 includes three sections 11, 12, and 13 that are described in detail below.

The first section 11 is a half-cascode current mirror having three transistors 16, 17, and 18, and a current source transistor 19. A so-called "half-cascode mirror" circuit arrangement is described in detail in the above mentioned copending application Ser. No. 08/070,274, incorporated by reference herein.

The transistor 16 of the half-cascode mirror circuit 11 is an NPN cascode transistor, transistor 17 is an NPN output transistor (sometimes referred to herein as an "active" transistor), and the transistor 18 is an NPN base current compensating transistor. The current sourcing transistor 19 is a PNP transistor. The cascode transistor 16 is connected between the collectors of the current sourcing transistor 19 and the active transistor 17. The base current compensating transistor 18 is connected between a voltage source appearing on line 20, and the base of the active transistor 17. The base of the current compensating transistor 18 is connected to the collector of the cascode transistor 16.

The second circuit section 12 is also a half-cascode mirror circuit constructed similarly to the first section 11, and also includes three transistors 22, 23, and 24, and a current sourcing transistor 25. The transistors 22–24 constitute, respectively, an NPN cascode transistor, an NPN active transistor, and an NPN base compensating transistor. The current sourcing transistor 25 is a PNP device. The transistors 22–25 replicate the transistors of the first circuit section 11.

The respective cascode transistors 16 and 22 of the first and second circuit sections 11 and 12 are sized such that the emitter area of the cascode transistor 16 is n-times larger than that of the cascode transistor 22.

A resistor 30 of value R is connected between the emitters of the cascode transistors 16 and 22. Additionally, in the FIG. 1 embodiment, a mirror transistor 31 is connected from a node between the cascode and active transistors 22 and 23 of the second circuit section 12 to a reference potential, or ground, on line 21. The base of the mirror transistor 31 is connected to the base of the active transistor 17, whereby the current flowing in the mirror transistor 31 mirrors the current flowing in the active transistor 17.

Bias for the bases of the cascode transistors 16 and 22 is provided by a current path formed of a PNP current sourcing transistor 38, an NPN transistor 39, having its base and collector interconnected, and an NPN transistor 40, connected in series between the voltage supply line 20 and the ground line 21. The base of the transistor 39 is connected to the bases of the cascode transistors 16 and 22.

The output circuit section 13 also has a current path formed of a PNP current sourcing transistor 42 and an NPN output transistor 43 connected in series between the voltage supply line 20 and the ground line 21. The base of the output transistor 43 is connected to the base of the active transistor 23 of the second circuit section 12, as well as to the base of a mirror transistor 44 through which the output current $I_{PTAT}$ is developed to the output terminal 5. Thus, the current that flows in the current flow path of the output circuit section 13 mirrors the current flowing in the output transistor 23 of the second circuit section 12.

A current source $I_{START}$ is connected between the base of the PNP transistor 42 and the ground line 21, as well as to the collector of the PNP transistor 42. The current source $I_{START}$ enables the circuit 10 to be self-starting, and, as described below, is not of critical value.

In operation, it will be seen that the same current flows through cascode transistors 16 and 22 from PNP transistors 19 and 25, respectively. Thus, $$V_{be16} = V_t \times \log\left(\frac{I_{19}}{nI_{sn0}}\right), \text{ and}$$

$$V_{be22} = V_t \times \log\left(\frac{I_{25}}{I_{sn0}}\right),$$

where $V_t$ is the thermal voltage, and $I_{sn0}$ is the reverse saturation current of the NPN transistors. This leads to:

$$V_{be22} - V_{be16} = V_t \cdot \log(n), \text{ since } I_{19} = I_{25}. \text{ Thus,}$$

-continued $$\begin{aligned}
I_{42} &= I_{23} = \left[ I_{e22} + \frac{(V_{be22} - V_{be16})}{R} \right] - I_{31} \\
&= \left[ I_{e22} + \frac{V_t \times \log(n)}{R} \right] - \left[ I_{e16} - \frac{V_t \times \log(n)}{R} \right] \\
&= \frac{2V_t \times \log(n)}{R} + I_{e22} - I_{e16}.
\end{aligned}$$

Since the common base current gains of transistors 16 and 22 are very close, the difference $I_{e22} - I_{e16}$ is nearly zero. Thus:

$$I_{out} = \frac{2V_t \times \log(n)}{R}$$

at the first order.

The output current is therefore directly proportional to the absolute temperature, since $$V_t = \frac{kT}{q},$$

with little base current error. The ratio $$\frac{\log(n)}{R}$$

is constant and fixes the slope of $I_{PTAT} = f(\tau)$.

Unlike classical PTAT current sources, there is no need of high-accuracy, cascoded PNP current mirrors to obtain a high precision for the output. The circuit is self-starting, provided a non-critical start-up current source $I_{START}$ connected between the base of the transistor 42 and ground initiates a current flow in the PNP mirror, which then grows in a regenerative way through transistors 23 and 43, until the output reaches its final value. At that point, current stops increasing by itself. The start-up current value can be smaller or larger than $I_{PTAT}$, and the start-up source does not have to be disconnected, since the output is independent of $I_{START}$.

Figure 2:
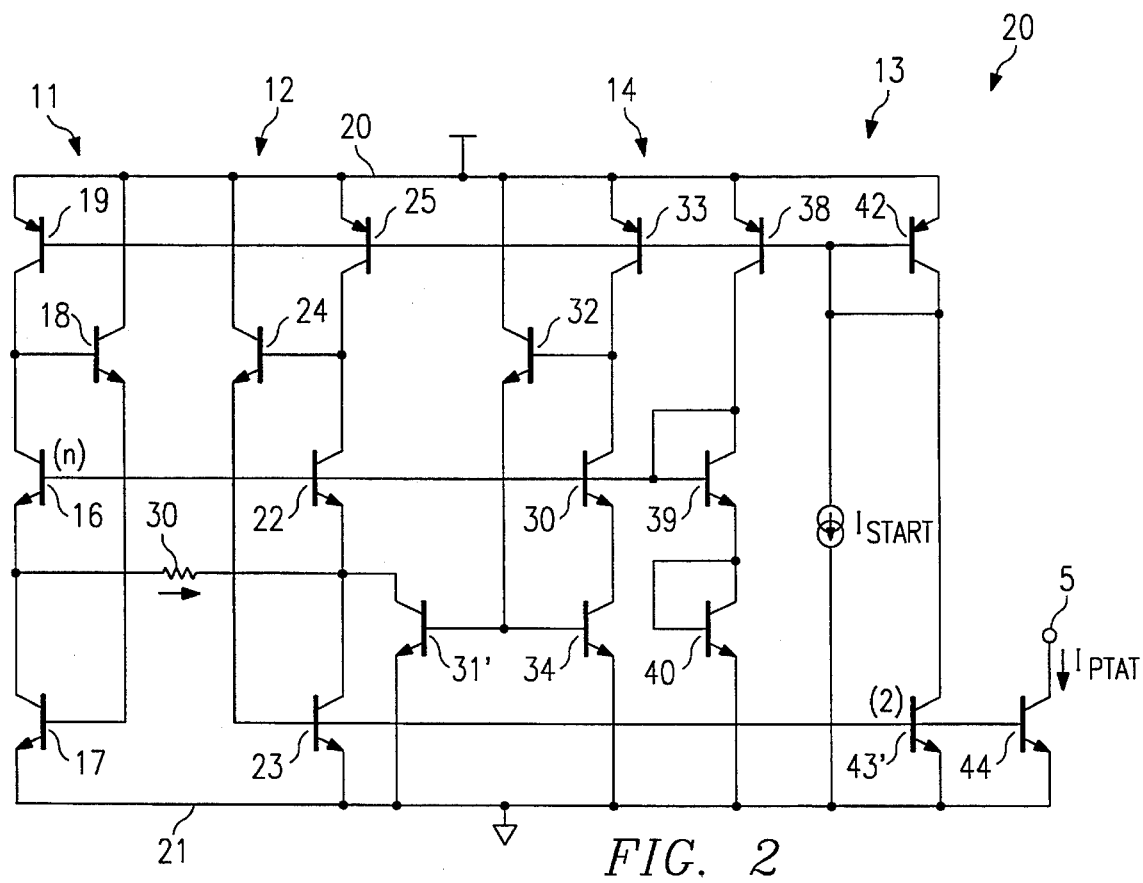
FIG. 2 is an electrical schematic diagram of another embodiment of a current source, in accordance with the invention.

An electrical schematic diagram of another embodiment of a current source 20 that produces an output current on output terminal 5 proportional to absolute temperature (PTAT), in accordance with the invention, is shown in FIG. 2. In the circuit embodiment 20 of FIG. 2 the assumption that $I_{e16} = I_{e22}$ does not need to be made.

The three sections 11, 12, and 13, are constructed similarly to the like numbered sections in FIG. 1, except that the base of the current diverting transistor 31' is connected to an additional half cascode circuit section 14 next described.

The additional circuit section 14 is also a half-cascode mirror circuit constructed in a manner similar to that of the first and second circuit sections 11 and 12, except for the connection of the current diverting transistor 31. More particularly, the third circuit section 14 includes an NPN cascode transistor 30, an NPN active transistor 34, and an NPN base current compensating transistor 32. A PNP current sourcing transistor 33 is connected between the voltage supply line 20 and the cascode transistor 30. The base of the cascode transistor 30 is connected to the bases of the cascode transistors 16 and 22 of the first and second circuit sections, as shown.

The output circuit section 13 is constructed similarly to the output stage 13 of FIG. 1, except that the output transistor 43' is constructed with its base sized to be twice the size of the base of the active transistor 23 of the second circuit section 12 to aid in ensuring proper start-up of the circuit 20.

The operation of the circuit 20 is similar to the operation of the circuit 10 of FIG. 1, except that the output current is independent of the current flowing from the emitter of the cascode transistor 16, since the current flowing from the emitter of the cascode transistor 22 is canceled by the current flowing through the diverting transistor 31'. The current flowing through the diverting transistor 31' is equal to the current flowing from the emitter of the cascode transistor 30. It can be seen that the current that flows through from the emitter of the cascode transistor 30 is exactly equal to the current that flows from the emitter of the cascode transistor 22.

In the circuit 20, the output is $$I_{out} = V_t \times \frac{\log(n)}{R},$$

independent of all transistor current gains.

Figure 3:
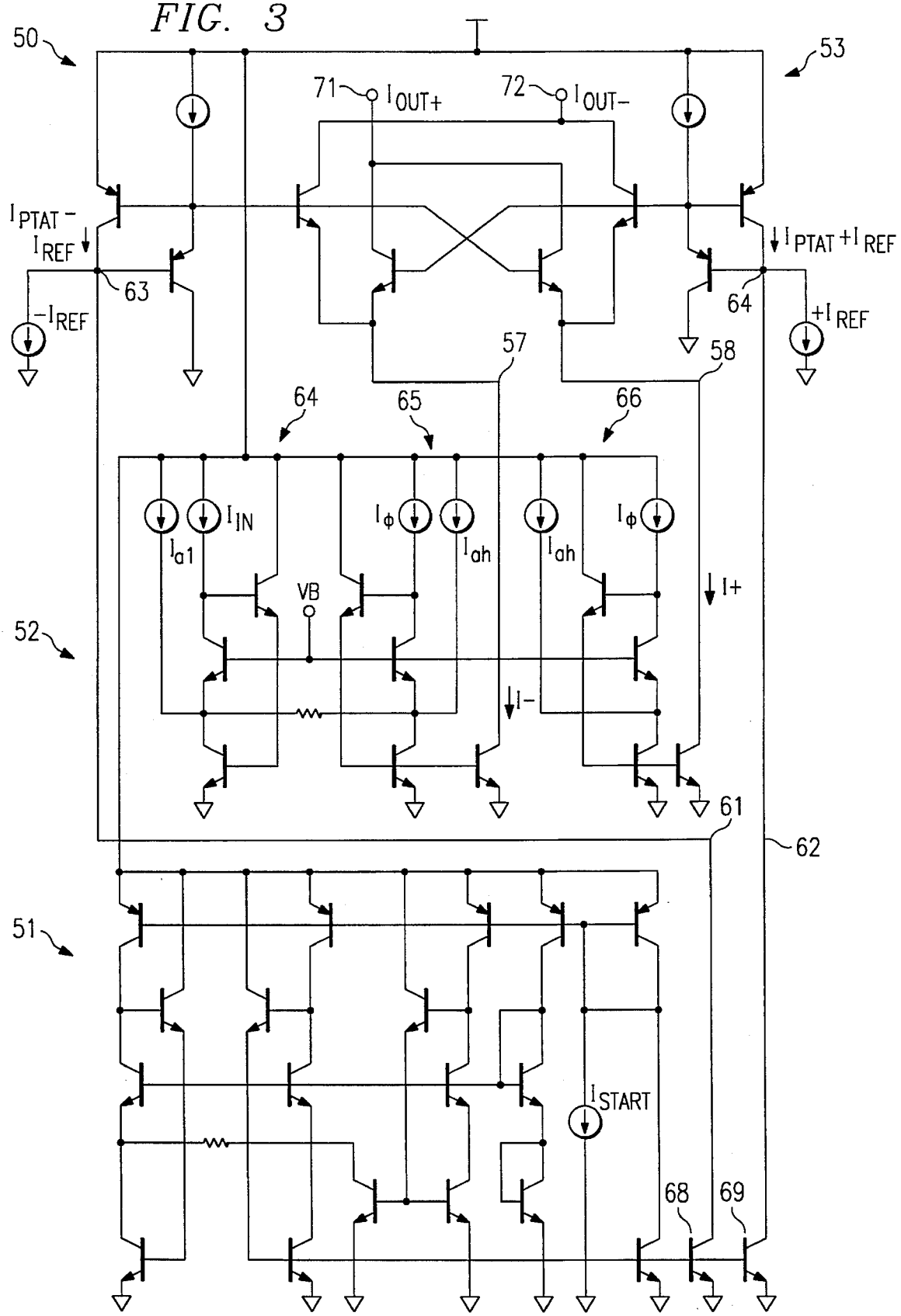
FIG. 3 is an electrical schematic diagram of a circuit in which a PTAT current source is used in conjunction with a logarithmic amplifier.

A circuit 50 is shown in FIG. 3 in which a PTAT current source 51, such as the PTAT current source 20 of FIG. 2, is used in conjunction with a logarithmic amplifier circuit 52, in a manner indicated in the above referenced copending patent application Ser. No. 08/070,276. More particularly, as indicated in said application Ser. No. 08/070,276, a logarithmic amplifier 52 has a translinear cell, such as the Gilbert gain or multiplier cell. The PTAT current source 51 has two output transistors 68 and 69 connected to furnish two current supply outputs on lines 61 and 62 for connection to respective nodes 53 and 64 of the Gilbert multiplier circuit 53, each output being thereby connected to provide reference currents to respective sides of said Gilbert cell 53.

The logarithmic amplifier 52 includes three sections 64, 65, and 66, each comprising a half-cascode mirror circuit. The input is applied, as shown, between the collector of the cascode transistor of the first half-cascode mirror circuit 64 and the supply voltage rail.

The PTAT current source circuit 51 has an additional NPN transistor 68 in parallel with the output transistor 69, described with respect to FIG. 2 above. It should be noted that a number of additional output transistors may be connected if desired in parallel with the output transistor 69 for additional PTAT current source outputs.

The output from the circuit 50 is derived at terminals 71 and 72 on the Gilbert multiplier circuit 53, the currents being represented by $I_{OUT+}$ and $I_{OUT-}$. Other suitable configurations for the circuit elements will be apparent to those skilled in the art.

In this particular embodiment, the Gilbert multiplier 53 is used to eliminate the $V_t$ factor in the differential output of the logarithmic amplifier:

$$I+ - I- = V_t \times \frac{\log\left(\frac{Iin}{I0}\right)}{R},$$

R being the resistor of the logarithmic amplifier section 52.

If a current $I_{ref}$, proportional to a temperature stable voltage $V_{ref}$, is fed into nodes 63 and 64 with negative and positive polarities, respectively, the classical equation of the Gilbert cell gives for the output of the total arrangement:

$$I_{out} = I_{out+} - I_{out-} = I_{ref} \times \frac{(I+ - I-)}{I_{PTAT}}$$

$$= I_{ref} \times \frac{V_t \times \log\left(\frac{Iin}{I0}\right)}{I_{PTAT}} \times$$

Or, assuming $I0 = \frac{V_{ref}}{R0}$, $$I_{ref} = \frac{V_{ref}}{R1}, \text{ and}$$

$$I_{PTAT} = \frac{V_t \times \log(n)}{R2}:$$

$$I_{out} = R2 \times V_{ref} \times \frac{\log\left(R0 \times \frac{Iin}{V_{ref}}\right)}{\log(n) \times R \times R1},$$

from which the temperature factor T has been canceled by division.

Simple multiplication by a reference current $I_{ref}$, and division by a PTAT current source $I_{PTAT}$, therefore allows the temperature factor T to be eliminated from the output current, provided I0 is also made proportional to a temperature independent voltage source, like $V_{ref}$.

The same principle can be applied to voltage-mode circuits with some additional voltage-to-current and current-to-voltage conversions:

If we have $$Iin = \frac{Vin}{R3}$$

(Vin is the logarithmic amplifier input voltage), and after conversion of the output current $I_{out}$ to a voltage with the law $$V_{out} = \frac{R4}{I_{out}},$$

one obtains an output voltage of the form:

$$V_{out} = \left(\frac{R2 \times R4}{R \times R1}\right) \times \left(\frac{V_{ref}}{\log(n)}\right) \times \log\left(\frac{R \times Vin}{R3 \times V_{ref}}\right),$$

which is suited to temperature stable voltage-mode applications.

It should be noted that temperature compensation of the logarithmic amplifier can be achieved with a number of other implementations of the Gilbert multiplier, as long as they perform the proper current multiplication and division. The same applies to the exponential converter circuits of application Ser. No. 08/070,276. In that case, the temperature cancellation technique must be inserted between the input signal and the input node of the exponential cell.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A PTAT current source, comprising:

first and second half cascode current mirror circuits, connected to produce a difference in a base-emitter voltage drop of a first cascode transistor of said first half cascode mirror circuit from a base-emitter voltage drop across a second cascode transistor of said second half cascode mirror circuit is produced that is a function of a thermal voltage times a logarithm of a size ratio between emitter areas of said first and second cascode transistors that is converted into a current in said second half cascode mirror circuit;

an output circuit, connected to said second mirror circuit to provide an output current that is mirrored from a current in an output transistor of said second half cascode current mirror circuit.

2. The PTAT current source of claim 1 wherein said first and second half cascode mirror circuits and said output circuit are comprised of NPN transistors.

3. A PTAT current source, comprising:

first and second current mirror circuits, each comprising a cascode transistor, an output transistor in series with said cascode transistor, and a base current compensating transistor having a control element connected to said cascode transistor on a side away from said output transistor, and a current diverting transistor connected across the output transistor of said second current mirror circuit, said cascode transistors of said first and second current mirror circuits having differently sized emitter areas;

a resistor connected between said cascode transistors of said first and second current mirror circuits across which a differential current is developed;

and an output circuit for developing an output in response to a current developed in said output transistor of said second current mirror circuit.

4. The PTAT current source of claim 3 wherein said output circuit comprises a third mirror circuit including an output transistor connected to mirror a current in the output transistor of said second current mirror circuit.

5. The PTAT current source of claim 4 wherein said cascode, output, and base current compensating transistors of said first, second, and output circuits are NPN transistors.

6. The PTAT current source of claim 4 further comprising a current source connected across the output transistor of said third mirror circuit to start-up the PTAT current source.

7. The PTAT current source of claim 6 wherein said cascode, output, and base current compensating transistors of said first, second, and third mirror circuits are NPN transistors.

8. The PTAT current source of claim 4 further comprising a current source connected to supply a start-up current to said fourth current mirror circuit, whereby said PTAT current source is self starting.

9. The PTAT current source of claim 4 further comprising an output current mirror transistor connected to mirror a current in an output transistor of said third current mirror circuit.

10. The PTAT current source of claim 9 wherein said output current mirror transistor has an emitter area that is sized differently from said output transistor of said second current mirror circuit.

11. The PTAT current source of claim 3 further comprising a current flow path connected to provide a bias voltage on current control elements of said cascode transistors.

12. A current source that produces an output current proportional to absolute temperature, comprising:

a first half-cascode current mirror section, including a cascode transistor, an active transistor, and a base current compensating transistor;

said cascode transistor being connected between a current source and the active transistor, said base current compensating transistor being connected between a voltage source and a base of the active transistor, and the base of the current compensating transistor being connected to the collector of the cascode transistor;

a second half-cascode current mirror section, including a cascode transistor, an active transistor, and a base current compensating transistor;

said cascode transistor being connected between a current source and the active transistor, said base current compensating transistor being connected between a voltage source and a base of the active transistor, and the base of the current compensating transistor being connected to the collector of the cascode transistor;

said cascode transistors being configured with their respective emitter areas sized such that the emitter area of the cascode transistor of said first half-cascode current mirror section is n-times larger than the emitter area of the cascode transistor of said second half-cascode current mirror section;

a resistor connected between the cascode transistors;

a current diverting mirror transistor connected across the active transistor of the second half-cascode mirror section, said current diverting mirror transistor having a base connected to a base of the active transistor of said first half-cascode current mirror section;

and an output circuit connected to mirror a current in said active transistor of said second half-cascode current mirror section.

13. The current source of claim 12 further comprising a start-up circuit connected to said output circuit, said start-up circuit being constructed to remain in operative connection to said output circuit even after start-up.

14. The current source of claim 12 wherein said cascode, active, and base current compensating transistors of said first and second half-cascode current mirror sections are NPN transistors.

15. The current source of claim 12 wherein said output circuit comprises a transistor connected to said active transistor of said second half-cascode mirror section to mirror the current in said active transistor of said second half-cascode mirror section.

16. The current source of claim 15 wherein said cascode, active, and base current compensating transistors of said first and second half-cascode current mirror sections are NPN transistors.

17. A current source that produces an output current proportional to absolute temperature, comprising:

a first half-cascode current mirror section, including a cascode transistor, an active transistor, and a base current compensating transistor;

said cascode transistor being connected between collectors of a current sourcing transistor and the active transistor, said base current compensating transistor being connected between a voltage source and a base of the active transistor, and a base of the current compensating transistor being connected to a collector of the cascode transistor;

a second half-cascode current mirror section, including a cascode transistor, an active transistor, and a base current compensating transistor;

said cascode transistor being connected between collectors of a current sourcing transistor and the active transistor, said base current compensating transistor being connected between a voltage source and a base of the active transistor, and a base of the current compensating transistor being connected to a collector of the cascode transistor;

said respective cascode transistors being configured with their emitter areas sized such that the emitter area of the cascode transistor of said first half-cascode current mirror section is n-times larger than the emitter area of the cascode transistor of said second half-cascode current mirror section;

a resistor connected between the cascode transistors;

a third half-cascode current mirror section, including a cascode transistor, an active transistor, and a base current compensating transistor;

said cascode transistor being connected between the collectors of the current sourcing transistor and the active transistor, said base current compensating transistor being connected between a voltage source and a base of the active transistor, and the base of the current compensating transistor being connected to the collector of the cascode transistor;

a current diverting mirror transistor connected across the active transistor of the second half-cascode mirror section, said mirror transistor having a base connected to a base of the active transistor of said third half-cascode current mirror section;

and an output circuit connected to mirror a current in said active transistor of said second half-cascode current mirror section.

18. The current source of claim 17 wherein said cascode, active, and base current compensating transistors of said first and second half-cascode current mirror sections are NPN transistors.

19. The current source of claim 17 wherein said output circuit comprises a transistor connected to said active transistor of said second half-cascode mirror section to mirror the current in said active transistor of said second half-cascode mirror section.

20. The current source of claim 17 further comprising a current source connected to supply a start-up current to said output circuit, whereby said current source is self starting.

21. The current source of claim 19 wherein said cascode, active, and base current compensating transistors of said first and second half-cascode current mirror sections are NPN transistors.

22. A logarithmic amplifier circuit comprising:

first and second mirror circuits, each comprising an active transistor, a cascode transistor, and a base current compensating transistor, the cascode and active transistors being connected in series between an input node connected to the cascode transistor and a reference potential connected to the active transistor, a base of the cascode transistor being connected to a bias voltage, and the base current compensating transistor being connected between a supply voltage source and a base of the active transistor, a base of the base current compensating transistor being connected to the input node;

a resistor connected between the cascode and active transistors of the first and second mirror circuits;

and an output circuit for developing first and second output signals in response to a current flowing of one of said active transistors;

whereby when an input current is applied between the input node and the supply voltage source of the first mirror circuit, and a first reference current is applied between the input node and the supply voltage source of the second mirror circuit, the first and second output signals have a logarithmic relationship to the input current;

a translinear cell connected to receive as inputs said first and second output signals from said logarithmic amplifier, and to produce a pair of outputs that are respective temperature compensated ratios of the first and second output signals;

a PTAT current source having two outputs, each output connected to provide temperature compensated reference currents to respective sides of said translinear cell.

23. The logarithmic amplifier circuit of claim 22 wherein said translinear cell is a Gilbert gain cell.

24. The logarithmic amplifier circuit of claim 22 wherein said PTAT current source, comprises:

first and second current cascode mirror circuits, wherein a difference in a base-emitter voltage drop of a first cascode transistor of said first cascode mirror circuit from a base-emitter voltage drop across a second cascode transistor of said second cascode mirror circuit is produced that is a function of a thermal voltage times a logarithm of a size ratio between emitter areas of said first and second cascode transistors;

and an output circuit, connected to said second mirror circuit to provide an output current that is mirrored from a current in an output transistor of said second current cascode mirror circuit, said output circuit having at least two output current lines for connection to said translinear cell.

25. The logarithmic amplifier circuit of claim 24 wherein said PTAT current source further comprises a current source connected to supply a start-up current to said output circuit, whereby said PTAT current source is self starting.

* * * * *